United States Patent [19]
White

[11] Patent Number: 5,942,448
[45] Date of Patent: Aug. 24, 1999

[54] METHOD OF MAKING CONTACTS ON AN INTEGRATED CIRCUIT

[75] Inventor: Lawrence Keith White, Princeton Junction, N.J.

[73] Assignee: Sarnoff Corporation, Princeton, N.J.

[21] Appl. No.: 08/803,785

[22] Filed: Feb. 24, 1997

[51] Int. Cl.⁶ .................... H01L 21/302; H01L 21/461
[52] U.S. Cl. ............................................ 438/745; 438/754
[58] Field of Search ...................................... 438/745, 754

[56] References Cited

U.S. PATENT DOCUMENTS 4,554,050  11/1985  Minford et al. .
4,782,380  11/1988  Shankar et al. .
5,244,836  9/1993   Lim .
5,726,501  3/1998   Matsubara .

*Primary Examiner*—John F. Niebling
*Assistant Examiner*—Josetta Jones
*Attorney, Agent, or Firm*—William J. Burke

[57] ABSTRACT

A method of forming a contact on a body of semiconductor material within an opening in a passivation layer of silicon carbide in which the contact is a bond pad of aluminum on the semiconductor body, a barrier layer of TiW on the bond pad and over a portion of the passivation layer around the bond pad, and a gold layer on the barrier layer. In forming the contact, the TiW barrier layer is etched with an aqueous solution of hydrogen peroxide and ethylene diamine tetraacetic acid.

9 Claims, 1 Drawing Sheet

METHOD OF MAKING CONTACTS ON AN INTEGRATED CIRCUIT

FIELD OF THE INVENTION

The present invention is directed to a method of making a contact for an integrated circuit, and, more particularly, to a method of etching a barrier layer of TiW without adversely affecting the interface between the barrier layer and an underlying passivation layer.

BACKGROUND OF THE INVENTION

Certain types of integrated circuit are protected by coating the surface of the device with a passivation layer of silicon carbide (SiC). Bond pads of a conductive metal, generally aluminum, are formed on the integrated circuit in openings in the SiC passivation layer. Although aluminum forms a good ohmic contact to the integrated circuit, it must be protected from oxidation which could adversely affect its conductivity. The aluminum bond pads are generally protected by a layer of gold (Au) which is coated over the bond pads. The gold is non-corrosive with respect to oxygen and is a good conductor. However, there is a problem of providing gold over aluminum. Therefore, a barrier layer is generally provided between the aluminum bond pad and the gold layer. One barrier material used in titanium-tungsten (TiW).

In making the contacts for the integrated circuit, a layer of the TiW barrier layer is deposited over the aluminum bond pads and the SiC passivation layer, and a layer of gold is deposited over the barrier layer. The gold layer is then defined to form the contact using standard photolithographic techniques and etching. Etching the gold layer to define the contacts exposes a portion of the underlying TiW barrier layer. The exposed portion of the TiW barrier layer is then etched away to form the final contact. A problem in defining the TiW barrier layer is to use an etchant which does not attack the interface between the TiW barrier layer and the SiC passivation layer, or at least does not excessively attack the interface. If such attack occurs, the TiW would undercut the gold layer thereby compromising the barrier metal integrity that protects the aluminum bond pad. Therefore, it is desirable to have an etchant which will etch the TiW barrier layer but will not attack, or excessively attack, the interface between the TiW barrier layer and the SiC passivation layer.

SUMMARY OF THE INVENTION

One aspect of the present invention is in a method of etching a layer of TiW which is over a layer of SiC. The method comprises applying to the TiW a liquid etchant comprising an aqueous solution of hydrogen peroxide and ethylene diamine tetraacetic acid.

Another aspect of the present invention is in a method of making a contact to a conductive bond pad on a body of a semiconductor material which has a layer of a silicon carbide passivation layer thereon and around the bond pad. The method comprises applying a layer of a TiW barrier layer over the bond pad and the passivation layer, and applying a layer of gold over the barrier layer. The gold layer is then defined to substantially the size of the bond pad thereby exposing a portion of the barrier layer. The exposed portion of the barrier layer is then etched with an aqueous solution of hydrogen peroxide and ethylene diamine tetraacetic acid.

DETAILED DESCRIPTION

Figure 1:
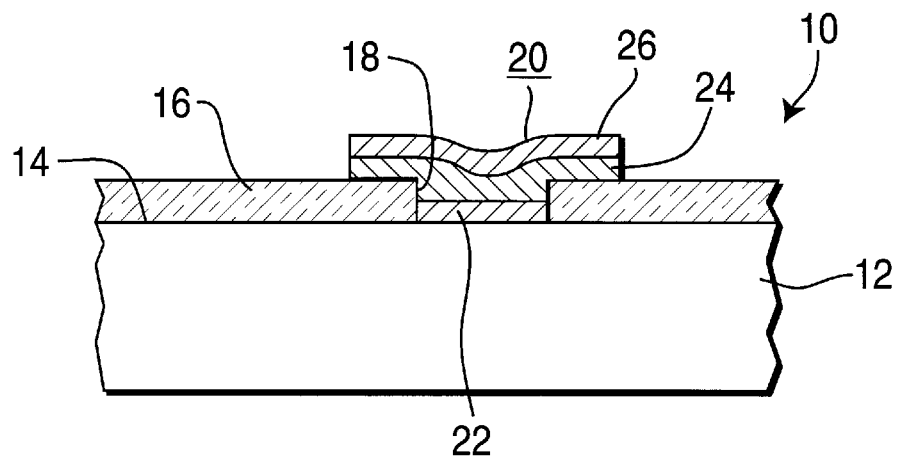
FIG. 1 is a sectional view of a portion of an integrated circuit having a contact made in accordance with the present invention.

Referring initially to FIG. 1, a portion of an integrated circuit having a contact made in accordance with the present invention is generally designated as 10. Integrated circuit 10 comprises a body 12 of a semiconductor material, such as single crystalline silicon, having a surface 14. Within the body 12 are a plurality of active devices, not shown. The surface 14 is covered with a passivation layer 16 of silicon carbide (SiC) which has an opening 18 therethrough where a contact 20 is provided. The contact 20 comprises a layer 22 of a highly conductive metal which makes good ohmic contact to the body 12 on the surface 14 within the opening 18. The metal layer 22 is generally of aluminum (Al). On the aluminum layer 22 is a barrier layer 24 of titanium-tungsten (TiW) which fills the opening 18 and overlaps the SiC passivation layer 16 around the opening 18. Covering the barrier layer 24 is a layer 26 of gold (Au) which is highly conductive but is not readily oxidized.

Figure 2:
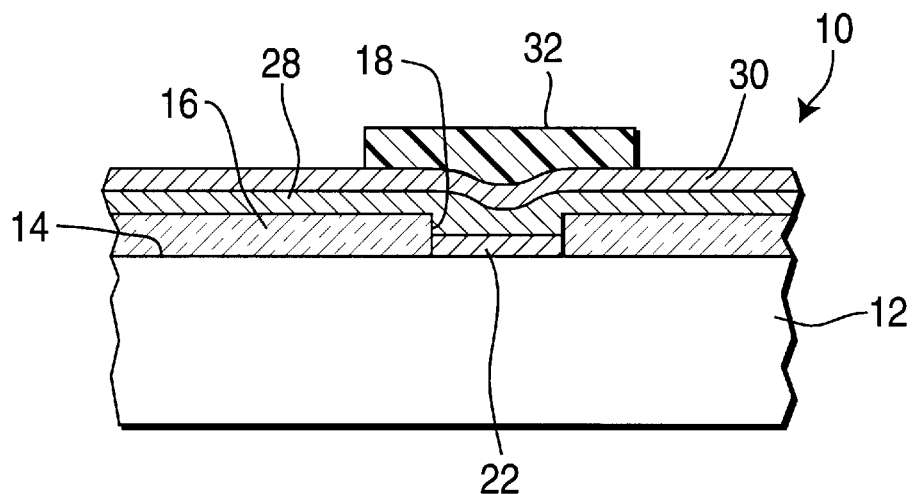
FIG. 2 is a sectional view of the portion of the integrated circuit shown in FIG. 1 illustrating an initial step in the method of the present invention.

Referring now to FIG. 2, there is illustrated the initial steps of forming the contact 20 in accordance with the method of the present invention. After the aluminum layer 22 is formed in the opening 18 in the SiC passivation layer 16, a layer 28 of TiW is coated over the aluminum layer 22 and over the passivation layer 16. This can be achieved by any well known deposition process, such as sputtering or evaporation of the metal in a vacuum and depositing the metals on the device. Then a layer 30 of gold is deposited over the TiW layer 28. This can be carried out by the same process used to deposit the TiW layer 28. A masking layer 32, such as of a resist, is then provided on the gold layer 30 over the region of the gold layer 30 which is to form the contact 20. The masking layer 32 can be defined by the well known photolithographic technique and etching. Thus, the masking layer 32 leaves exposed the portions of the gold layer 32 which does not form the contact 20.

Figure 3:
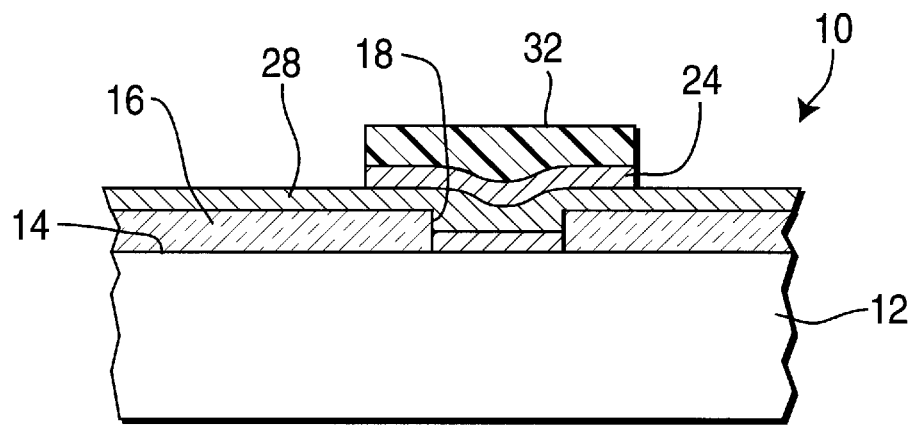
FIG. 3 is a sectional view similar to FIG. 2 illustrating a further step in the method of the present invention.

As illustrated in FIG. 3, the exposed portion of the gold layer 30 is then removed with a suitable etchant, such as a mixture of potassium iodine and iodide, to form the gold contact portion 26. This exposes a portion of the TiW layer 28. The exposed portion of the TiW layer 28 is then removed with a suitable etchant to form the TiW barrier 24 of the contact 20. In removing the exposed portion of the TiW layer 28, an etchant must be used which does not undercut the interface between the TiW barrier 24 and the silicon carbide passivation layer 16. If this interface is undercut, it could expose the aluminum contact layer 22. If the aluminum contact layer 22 is exposed, it could be subjected to oxidation which would adversely affect the contact 20. To prevent the undercutting of the interface between the TiW barrier 24 and the silicon carbide passivation layer 16 the etchant used is an aqueous solution of hydrogen peroxide ($H_2O_2$) and ethylene diamine tetraacetic acid. The etchant may also contain ammonia hydroxide. A suitable etchant comprises a mixture of 2.6 grams of ethylene diamine tetraacetic acid, 8.4 ml of ammonia hydroxide and 200 ml. of water to which is added 100 ml. of hydrogen peroxide. This provides for a good etching of the exposed portion of the TiW layer 28 without excessively undercutting the interface between the TiW barrier 24 and the SiC passivation layer 16.

Although the resist masking layer 32 could be removed after the gold layer 30 is etched, it has been found that undercutting of the gold contact 26 is prevented by leaving the masking layer 32 on the gold contact 26 while etching the TiW barrier layer 28. After the TiW barrier layer 28 is etched, the resist masking layer 32 can be removed with an oxygen plasma.

Thus, there is provided by the present invention a method of forming a contact to a semiconductor body in an opening in a SiC passivation layer in which the contact comprises a layer of aluminum in the opening and in good ohmic contact with the semiconductor body, an outer layer of gold over the aluminum layer and a barrier layer of TiW between the gold and aluminum layers. The TiW barrier layer and the gold layer extend over the opening in the passivation layer and overlap the passivation layer around the edge of the opening. In forming the contact, the TiW layer which forms the barrier is etched with an aqueous solution of hydrogen peroxide and ethylene diamine tetraacetic acid which etches the TiW but does not excessively undercut the interface between the TiW barrier and the SiC passivation layer.

Also, the resist masking layer which is used to mask the gold layer when it is being etched to form the contact is left on the gold contact while etching the TiW barrier layer to prevent undercutting the gold contact.

What is claimed is:

1. A method of etching a layer of TiW which is over layer of silicon carbide comprising the step of applying to the TiW a liquid etchant comprising an aqueous solution of a mixture of hydrogen peroxide and ethylene diamine tetraacetic acid.

2. The method of claim 1 in which the etchant also includes ammonia hydroxide.

3. The method of claim 2 in which the etchant comprises 2.6 grams of ethylene diamine tetraacetic acid, 8.4 ml. ammonia hydroxide, 100 ml. hydrogen peroxide and 200 ml. water.

4. In a method of making a contact to a conductive bond pad on a body of a semiconductor material which has a passivation layer of silicon carbide thereon and surrounding the bond pad, the steps of:

applying a barrier layer of TiW on the bond pad and over the passivation layer;

applying a layer of gold over the barrier layer;

defining the gold layer to substantially the area of the bond pad and a portion of the passivation layer around the bond pad thereby exposing a portion of the barrier layer; and then etching the exposed portion of the barrier layer with an etchant comprising an aqueous solution of a mixture of hydrogen peroxide and ethylene diamine tetraacidic acid.

5. The method of claim 4 in which the etchant also includes ammonia hydroxide.

6. The method of claim 5 in which the etchant comprises 2.6 grams of ethylene diamine tetraacidic acid, 8.4 ml. ammonia hydroxide, 100 ml. hydrogen peroxide and 200 ml. water.

7. The method of claim 4 in which defining the gold layer comprises applying a masking layer over the portion of the gold layer which is over the bond pad and the surrounding portion of the passivation layer to expose a portion of the gold layer, and then etching away the exposed portion of the gold layer.

8. The method of claim 7 in which the masking layer is left on the gold layer while etching the barrier layer.

9. The method of claim 7 in which after the barrier layer is etched, the masking layer is removed with an oxygen plasma.

* * * * *

UNITED STATES PATENT AND TRADEMARK OFFICE
CERTIFICATE OF CORRECTION

PATENT NO. : 5,942,448
DATED : August 24, 1999
INVENTOR(S) : White, Lawrence K.

It is certified that error appears in the above-identified patent and that said Letters Patent are hereby corrected as shown below:

At Column 1, after the title, insert the following:

"This invention was made under U.S. Government Contract No. F33615-93-C-1355. The Government has certain rights in the invention."

Signed and Sealed this

Tenth Day of April, 2001

Attest:

NICHOLAS P. GODICI

Attesting Officer

Acting Director of the United States Patent and Trademark Office